US010057521B1

United States Patent
Sanchez et al.

(10) Patent No.: US 10,057,521 B1
(45) Date of Patent: Aug. 21, 2018

(54) HIGH-SPEED CMOS CAMERA

(71) Applicant: Sandia Corporation, Albuquerque, NM (US)

(72) Inventors: Marcos O. Sanchez, Albuquerque, NM (US); Liam D. Claus, Albuquerque, NM (US); Gideon Robertson, Albuquerque, NM (US); John L. Porter, Jr., Sandia Park, NM (US); Sean Pearson, Albuquerque, NM (US); Kurt Wessendorf, Albuquerque, NM (US); Tom Gurrieri, Albuquerque, NM (US); Thomas Hill, Albuquerque, NM (US); Andrew Montoya, Albuquerque, NM (US); Doug Trotter, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 55 days.

(21) Appl. No.: 15/234,636

(22) Filed: Aug. 11, 2016

(51) Int. Cl.
  *H04N 5/374* (2011.01)
  *H01L 27/146* (2006.01)
  *H04N 5/378* (2011.01)

(52) U.S. Cl.
  CPC ....... *H04N 5/374* (2013.01); *H01L 27/14634* (2013.01); *H01L 27/14636* (2013.01); *H01L 27/14643* (2013.01); *H04N 5/378* (2013.01)

(58) Field of Classification Search
  CPC .. H04N 5/374; H04N 5/378; H01L 27/14634; H01L 27/14636; H01L 27/14643
  See application file for complete search history.

(56) References Cited

U.S. PATENT DOCUMENTS

| 6,888,568 | B1* | 5/2005 | Neter | H04N 5/361 348/222.1 |
| 9,167,169 | B1* | 10/2015 | Rivard | H04N 5/2355 |
| 9,521,346 | B1* | 12/2016 | Cugler-Fiorante | H04N 5/378 |
| 2013/0308036 | A1* | 11/2013 | Peng | H04N 5/23212 348/345 |
| 2015/0138410 | A1* | 5/2015 | Dai | H04N 5/37457 348/300 |

(Continued)

OTHER PUBLICATIONS

Baker, R. J. [CMOS: Circuit Design, Layout, and Simulation], 2010John Wiley and Sons, Inc, New Jersey, 561-567.

(Continued)

*Primary Examiner* — Albert Cutler

(74) *Attorney, Agent, or Firm* — Martin I. Finston

(57) ABSTRACT

A high-speed CMOS camera includes an array of pixel circuits coupled to a photodiode array, an oscillator circuit, and a pattern generator circuit. The pattern generator circuit includes a high speed shift register and a non-overlap generator. The shift register is programmable to produce a pulse train of trigger pulses that defines an interframe and a frame's shutter duration. The non-overlap generator deserializes the incoming pulse train of trigger pulses, and it produces a time-separated reset pulse based on the pulse train of trigger pulses. The shift register is configured to permit the frame durations and the interframe times to be selected arbitrarily over specified ranges in increments of a basic time unit that depends on the oscillator period.

9 Claims, 9 Drawing Sheets

(56) References Cited

U.S. PATENT DOCUMENTS

| | | | |
|---|---|---|---|
| 2015/0326805 A1* | 11/2015 | Scott | H04N 5/378 |
| | | | 348/243 |
| 2017/0041571 A1* | 2/2017 | Tyrrell | H04N 5/335 |
| 2017/0142362 A1* | 5/2017 | Liu | H01L 27/14609 |
| 2017/0170225 A1* | 6/2017 | Asaba | H04N 5/37452 |
| 2017/0230598 A1* | 8/2017 | Takayanagi | H04N 5/378 |

OTHER PUBLICATIONS

Bennett, G., et al., "High-brightness, high-spatial-resolution, 6.151 keV x-ray imaging of inertial confinement fusion capsule implosion and complex hydrodynamics experiments on Sandia's Z accelerator," RSI 77 (2006).

Claus, L., et al., "An overview of the Ultrafast X-ray Imager (UXI) program at Sandia Labs", Proc. SPIE 9591, Target Diagnostics Physics and Engineering for Inertial Confinement Fusion IV, 95910P (Aug. 31, 2015); doi: 10.1117/12.2188336.

Claus, L., et al., "An overview of the Ultra-Fast X-ray Imager (UXI) program at Sandia Labs", Abstract for the 2015 SPIE optics + Photonics conference, SAND2015-0304C, Sandia National Laboratories, Jan. 2015.

Claus, L. et al., "Initial Characterization results of a 1024 × 448, 25 um multi-frame camera with 2 ns integration time for the Ultra-Fast X-ray Imager (UXI) program at Sandia National Laboratories", SAND2016-0899A, Sandia National Laboratories, Feb. 2016.

Etoh, T., et al., "Toward one giga frames per second-Evolution of in situ storage image sensors," Sensors, 2013, vol. 13, 4640-4658.

Khoshakhlagh, A. "Design of a Readout Integrated Circuit (ROIC) for Infrared Imaging Applications," Masters Thesis, Dept. of Electrical Engineering, University of New Mexico, Dec. 2010, pp. 5-24.

Kleinfelder, S., et al., "High-speed CMOS image sensor circuits with in situ frame storage," IEEE Trans. Nucl. Sci. 2004, vol. 51(4), 1648-1656.

Kwiatkowski, K., et al., "Ultra-fast high-resolution hybrid and monolithic CMOS imagers in multi-frame radiography," Proc. SPIE 2014, 9215.

Porter, J., "Development of a High-Speed Multi-frame CMOS Camera", SAND2013-2373C, Sandia National Laboratories, Mar. 2013.

Porter, J., "A Time-Gated Hybrid CMOS Sensor with Multi-Frame Storage for High-Speed X-Ray Imaging," SAND2014-4803C, Sandia National Laboratories, Jun. 1, 2014.

* cited by examiner

HIGH-SPEED CMOS CAMERA

STATEMENT OF GOVERNMENT INTEREST

This invention was made with Government support under Contract No. DE-AC04-94AL85000 awarded by the U.S. Department of Energy. The Government has certain rights in the invention.

FIELD OF THE INVENTION

The invention relates to high-speed electronic imaging devices.

ART BACKGROUND

The discipline of high-speed imaging has found many applications in medicine, science, engineering, and other fields. The advent of electronic image sensors such as focal plane arrays (FPAs) based on silicon photodiode sensors has extended the usefulness of this discipline by extending the available time resolutions far into the sub-microsecond regime.

A typical focal plane array (FPA) using CMOS technology is a hybrid assembly in which a wafer containing a photodiode array is bonded to a CMOS read-out integrated circuit (ROIC). The photodiode array typically contains tens of thousands to hundreds of thousands of individual photodiodes, each of which communicates with a respective pixel on the ROIC. In operation, each photodiode converts the energy of incident electromagnetic radiation or subatomic particles to electron-hole pairs. The electron-hole pairs, in turn, produce electric current that is sampled, integrated over a specified integration time in the underlying pixel of the ROIC, and stored on a hold capacitor as collected charge that is proportional to an output voltage.

The pixels are arranged in rows and columns. The pixel values are read out from the ROIC in a sequential manner so as to form one or more serial streams of data. In a row-wise approach, for example, each row of pixels is selected in sequence. The selected row is connected to an array of column amplifiers by column buses that are shared by all of the pixels in a given column. A control circuit sweeps the selected row, column-by-column, to assemble the amplified pixel outputs into a serial bitstream. The serial bitstream is passed downstream for analog-to-digital conversion (ADC) and further processing.

FPAs as described above can be used in streak cameras, which produce one-dimensional images in which the second dimension represents time, and in which extremely fine time-resolution can be achieved. FPAs can also be used in framing cameras. A framing camera produces two-dimensional images. Some framing cameras are able to produce a sequence of two or more images corresponding to respective time-resolved frames that are separated by an interframe interval of less than one microsecond.

One shuttering method used by framing cameras is rolling shuttering. In the rolling shutter method, the exposures of two adjacent frames (referred to for convenience as Frame 1 and Frame 2) can overlap. That is, each row begins its Frame-2 exposure as soon as it has completed its Frame-1 readout, without waiting for the rows behind it to complete their own Frame-1 readouts. This method provides very fast read-out, but valuable information may be lost when imaging an object that is changing rapidly.

Another shuttering method is global shuttering. In the global shutter method, all pixels are exposed simultaneously. This method provides highly time-resolved image information. However, the frame rate is limited by the speed with which the pixels can be read out and digitized. The greater the number of pixels, the lower the maximum achievable frame rate. As a consequence, there is a tradeoff between spatial resolution and the frame-to-frame time resolution that can be achieved.

For the study of shock-wave phenomena and other processes in rapidly evolving physical systems, the ability to perform sequential imaging with high spatial resolution at interframe times of tens of nanoseconds, or even less, would be highly advantageous. For this reason among others, there is a need for improved camera designs that achieve more favorable tradeoffs between spatial and temporal resolution than those that are currently applicable.

SUMMARY OF THE INVENTION

We have developed a high-speed CMOS camera with extremely short integration times and interframe times. Our new camera design has implementations as a framing camera and implementations as a streak camera. Various improved features have made it possible for our new camera to achieve better tradeoffs between spatial and temporal resolution than those heretofore available.

In an embodiment, our new camera includes a photodiode array and an array of pixel circuits in which each individual pixel circuit is coupled to a respective photodiode of the photodiode array. The camera also includes an oscillator circuit and a pattern generator circuit.

The oscillator circuit has a master trigger input that starts the oscillator, and it has an oscillator output that is periodic with an oscillator period.

The pattern generator circuit has an oscillator input coupled to the oscillator output. It also has a reset output coupled to the individual pixel elements, and it has at least first and second trigger outputs coupled to the individual pixel circuits for triggering respective first and second repeating frames.

The camera also includes a distribution network configured to replicate and propagate the reset and trigger signals from the reset and trigger outputs of the pattern generator to the individual pixel circuits.

Each pixel circuit comprises a storage element configured to store an output from its coupled photodiode upon receiving a trigger signal. Each pixel circuit is configured to reset its storage element upon receiving a reset signal.

The pattern generator circuit comprises a high speed shift register and a non-overlap generator. The shift register is programmable to produce a pulse train of trigger pulses that defines a frame's shutter duration and that further defines an interframe time between triggers for all frames. The non-overlap generator deserializer the incoming pulse train of trigger pulses, and it produces a time-separated reset pulse based on the pulse train of trigger pulses.

The shift register is configured to permit the frame durations and the interframe times to be selected arbitrarily by a user over specified ranges in increments of a basic time unit that depends on the oscillator period.

In embodiments, the pattern generator circuit performs frequency doubling, so that the basic time unit can be one-half the oscillator period. For example, a frequency-doubling circuit may make use of both edges of the oscillator signal using, e.g., a dual-edge D flip-flop.

In embodiments, the array of pixel circuits is partitioned into a left hemisphere and a right hemisphere, the distribution network is divided into substantially symmetric left and right halves, and each half distributes trigger and reset signals to its own hemisphere.

In embodiments, each frame is subdivided among at least a first and a second subframe. The rows of individual pixel circuits are partitioned among the subframes. A pulse-select circuit causes pixels only in those rows allocated to a particular subframe to be triggered when it is that subframe's turn to be triggered.

In embodiments, the camera is configured as a streak camera. The columns of individual pixel circuits are alternated with columns of delay elements. Within each row, the pixels receive trigger signals sequentially, such that each trigger signal is received after a cumulative delay due to all preceding delay elements.

Some embodiments include a special fast-startup arrangement for the oscillator circuit. Specifically, a relaxation oscillator in the oscillator circuit is configured in an astable multivibrator configuration in which two amplifying devices having respective inputs and outputs are cross-coupled. Within the relaxation oscillator, there is a path to ground from an ICC node coupled to an input of one of the cross-coupled devices. The path to ground passes through a trigger element that has an input that alternately enables and disables oscillation as it toggles between logic levels. The path to ground also passes through a bias element. The bias element is configured to maintain the ICC node at a voltage above ground that is controllable by an analog bias voltage applied to a bias input of the bias element.

In embodiments, the photodiode array is defined in a semiconductor detector chip, the array of pixel circuits is defined in a semiconductor read-out integrated circuit (ROIC) substrate, and the detector chip and the ROIC substrate are bonded in a monolithic assembly. The detector chip may, e.g., include two or more metallization levels capable of supporting passive components such as metal-insulator-metal (MIM) capacitors and resistors. One or more MIM capacitors may be connected between such metallization levels.

DETAILED DESCRIPTION

Figure 1:
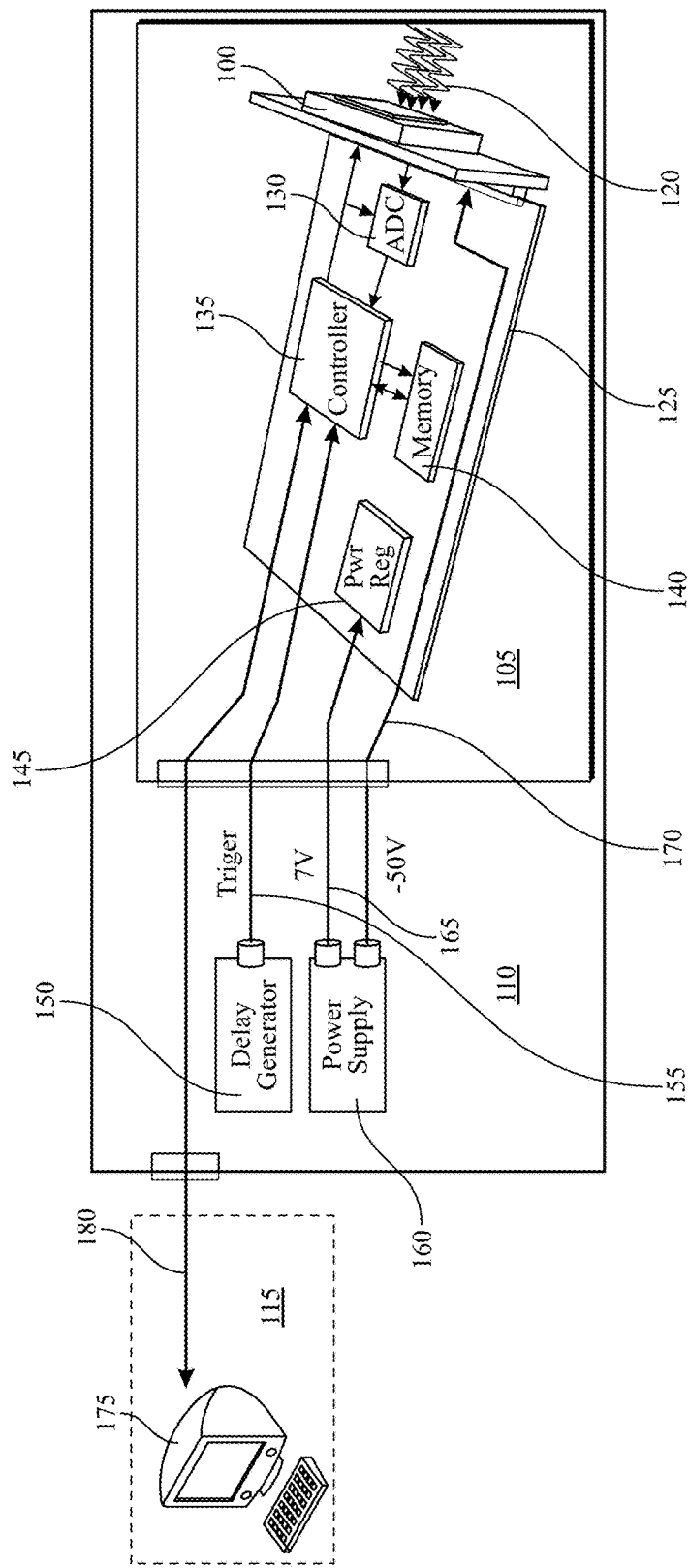
FIG. 1 is a block diagram of a typical experimental arrangement using a CMOS camera.

FIG. 1 is a block diagram of a typical experimental arrangement in which a CMOS camera 100 in a laboratory chamber 105 is supported by circuitry in an antechamber 110 and remotely controlled from a control room 115. As seen in the drawing, the camera is being impinged by a burst 120 of radiation, for example x-radiation, that contains the image information. A printed wiring board (PWB) 125 within chamber 105 contains an analog-to-digital converter (ADC) 130 which receives and processes data signals from the camera. The PWB also contains a local controller 135, a local memory 140, and a power regulator 145.

Within the antechamber 110, there is seen a delay generator 150 connected to the local controller on the PWB over trigger line 155. Also seen within the antechamber is power supply 160. In the figure, the power supply is shown as having a 7-volt output, which is delivered to the power regulator on the PWB over low-voltage line 165. The power supply is further shown as having a reverse polarity 50-volt output, which is delivered to the camera over high-voltage line 170 to provide bias to the photodiodes.

As seen in the figure, control panel 175 in control room 115 communicates with the local controller on the PWB over control line 180, which may, e.g., be a standard RS422 serial communication cable.

In examples, the camera includes a silicon photodiode array that is directly connected to a ROIC, which is a CMOS IC, through wafer-to-wafer bonding. The bonding may be facilitated, for example, by a silicon dioxide layer applied using commercially available direct bond interconnect technology.

In an example, the silicon photodiode array contains 458,752 diodes arranged in 1024 rows and 448 columns. These array dimensions are illustrative and not limiting; other dimensions are readily achievable. Example diodes are 25 μm square, although other diode dimensions are not excluded. Depending on the desired application, photodiodes can be chosen to have any of a great range of spectral sensitivities and sensitivities to sub-atomic particles. In one non-limiting example, the photodiodes are sensitive to 6-keV x-rays and to light in the visible and near-IR spectrum from 500 nm to 800 nm. In other examples, the photodiodes are sensitive to a broader spectrum of infrared radiation.

In the CMOS IC that forms the lower portion of the camera, the photogenerated charge from each photodiode is stored on a hold capacitor during an integration time. In an example, the hold capacitor is a 250 fF metal-insulator-metal (MIM) capacitor connected between metallization layers of the CMOS IC.

Figure 2:
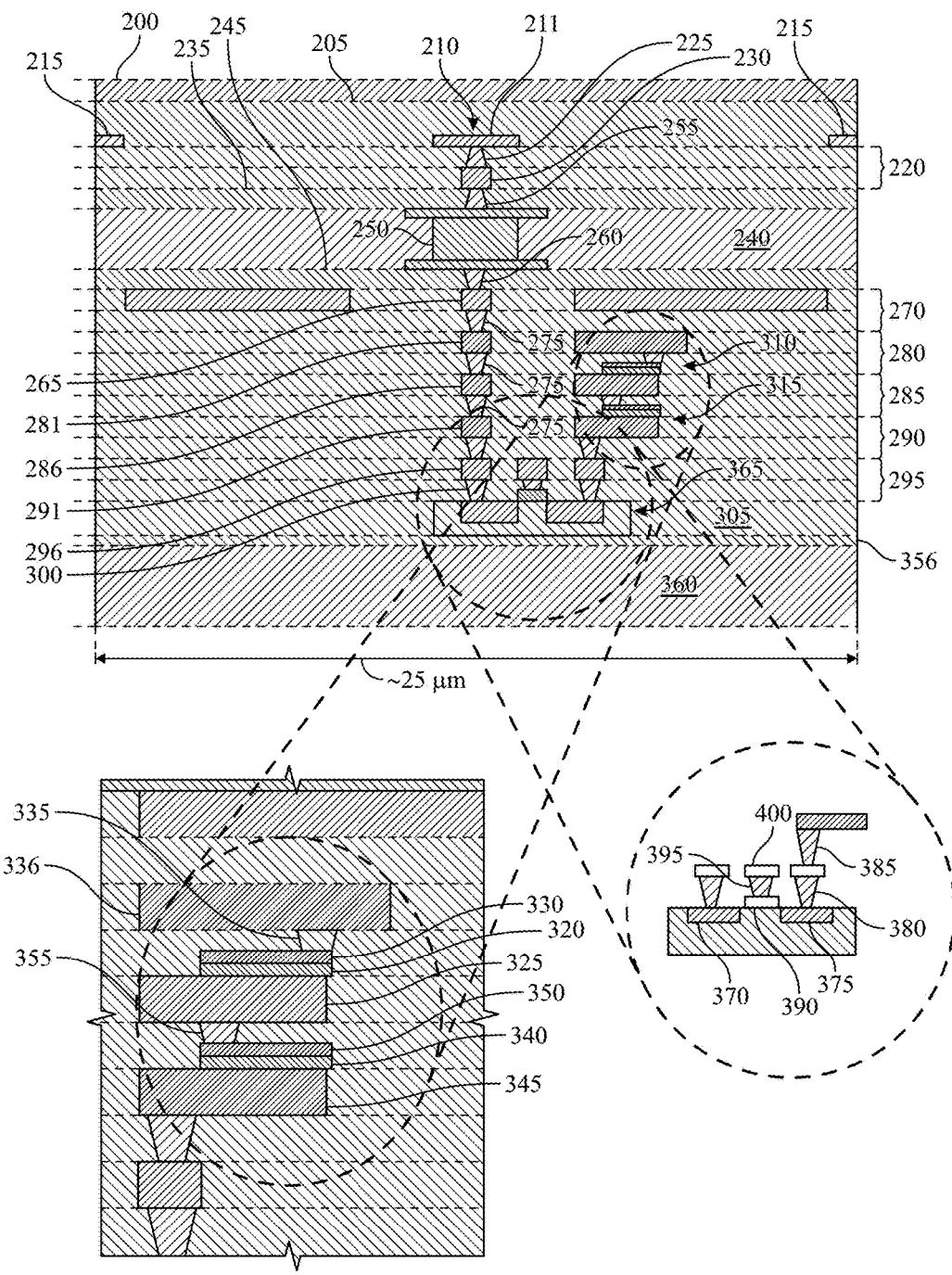
FIG. 2 is a simplified cross-sectional view of one pixel area of a camera described here.

FIG. 2 is a simplified cross-sectional view of one pixel area of the camera. From the top down, the features shown are as described below, with non-limiting examples of composition and dimensions:

Layer 200 is the back-side metallization of the diode array, consisting of 900 nm of aluminum and 100 nm of titanium nitride.

Layer 205 is the silicon photodetector layer. This layer is 25 μm thick and contains diffused sublayers 210 and 215.

Sublayer 210 is doped n+ with phosphorus to a depth of 250 nm, and sublayer 215 is doped p+ with boron to a depth of 150 nm.

Layer 220 is the metal-1 layer of the detector chip. Metal-1 is deposited in the sequence titanium, 20 nm; titanium nitride, 50 nm; aluminum, 700 nm; titanium nitride, 100 nm in both the detector chip and the MOS IC. As seen in the figure, a tungsten contact 225, lined with titanium nitride, connects an n+ contact region 211 of sublayer 210 to a patterned feature 230 of metal-1.

Layers 235 and 245 are passivation layers of 1.7-μm silicon dioxide.

Layer 240 is a 2-μm direct-bond interconnect layer of silicon dioxide that bonds the detector chip to the CMOS IC. As seen in the figure, via 250 crosses the interconnect layer to connect metal-1 feature 230, through tungsten contacts 255 and 260, to a patterned feature 265 of metal-5 in metallization layer 270. Metal-5 has the same composition as metal-1, in the dimensional sequence 20/50/1200/50 nm.

As further seen in the figure, a vertical sequence of tungsten vias 275 transmits the signal from the n+ contact region downward through the interlayer dielectric and through respective patterned metal features 281, 286, 291, and 296 of layer 280 (metal-4), layer 285 (metal-3), layer 290 (metal-2), and layer 295 (metal-1). Titanium nitride-lined tungsten contact 300 connects metal-1 feature 296 to silicon device layer 305 as discussed in more detail below. Metal-1, metal-2, metal-3, and metal-4 all have the same compositional sequence as metal-5, and they all have the dimensional sequence 20/50/700/100 nm.

Also represented in FIG. 2 are two MIM capacitors 310, 315. Capacitor 310 consists of 50-nm silicon nitride dielectric 320 deposited directly on metal-3 feature 325, and 150-nm titanium nitride conductive plate 330 deposited directly on dielectric 320. Tungsten via 335 connects plate 330 to metal-4 feature 336. Capacitor 315 consists of 50-nm silicon nitride dielectric 340 deposited directly on metal-2 feature 345, and 150-nm titanium nitride conductive plate 350 deposited directly on dielectric 340. Tungsten via 355 connects plate 350 to metal-3 feature 325.

In our illustrative example, a capacitance of 250 fF is obtained, per capacitor, by patterning the capacitors with a length of 9.15 μm and a width of 4.00 μm.

As seen in the figure, device layer 305 overlies a 250-nm layer 356 of buried oxide (BOX), which in turn overlies an SOI substrate 360 that is exemplarily 675 μm thick.

The figure includes a representative transistor 365 in the device layer. The transistor includes an n-type source or drain region 370 connected through tungsten contact 300 and the overlying chain of vias to n+ contact region 211 of sublayer 210. The transistor includes an n-type drain or source 375 connected through tungsten vias 380 and 385 to the MIM capacitors 310 and 315. A 310-nm polysilicon gate electrode 390 is connected through titanium-nitride-lined tungsten contact 395 to metal-1 feature 400.

The silicon island in which transistor 365 is fabricated is 250 nm thick. The n+ source and drain regions are diffused with arsenic to a depth of 110 nm. The p+ channel region is diffused with boron to a depth of 250 nm.

Figure 3:
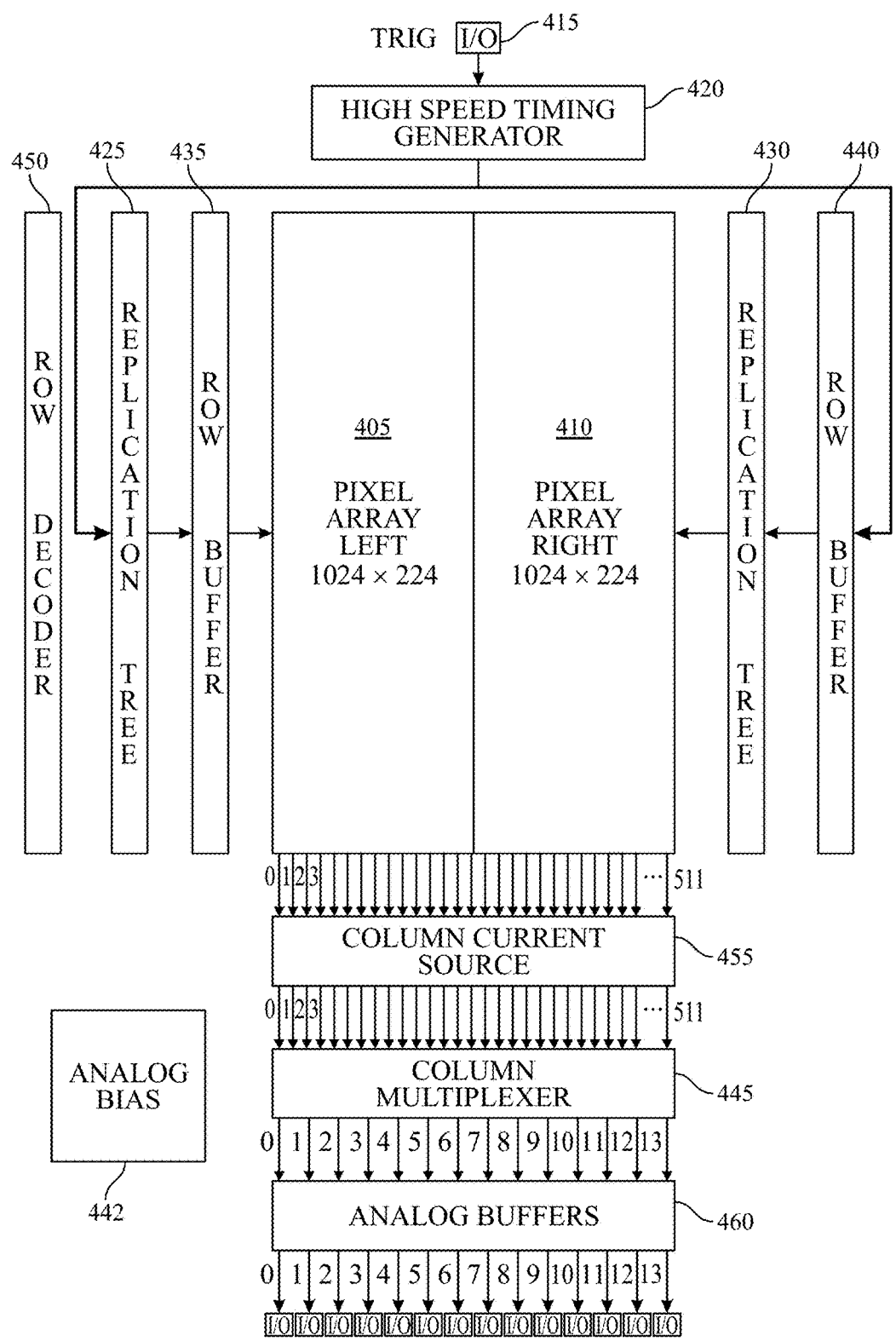
FIG. 3 is a simplified block diagram illustrating the architecture of a camera described here.

Architectural Overview. FIG. 3 is a simplified block diagram illustrating the architecture of our camera in an example embodiment. As mentioned above, there is a 1024× 448 pixel array of 25-μm pixels. As will be explained below, two frames of in-situ pixel storage are accessible with each read-out.

As seen in the figure, the pixel array is subdivided into a left hemisphere 405 and a right hemisphere 410. This facilitates hemispheric distribution of timing signals, which is desirable for reasons explained below. An off-chip trigger 415 and an off-chip high-speed timing generator 420 launch the timing signals toward the camera.

On the ROIC, each of the replication trees 425 and 430 distributes 1024 replicas of the timing information to the 1024 half-rows in its respective hemisphere. Each of 1024 left-hemisphere row buffers 435 and each of 1024 right-hemisphere row buffers 440 provides the power to drive its respective replica of the timing information across a large distributed RC load. This load is due in part to the gate capacitances of the 224 transistors that trigger the respective pixels of the half-row, and it is due in part to the resistance and capacitance of the metal interconnections.

The analog bias block 442 generates stable voltages or currents from a reference voltage. The voltages and currents generated are used to power the readout circuits such as the column bias and pad drivers.

Each pixel has, on the ROIC, two stacked pairs of hold capacitors such as the stacked MIM capacitors 310 and 315 of FIG. 2. Each of these stacked pairs integrates and holds the photocurrent generated during a respective exposure frame. The signal-level terminal of each stacked pair is connected to a respective source follower for frame readout.

With further reference to FIG. 3, the source follower outputs (for both frames) are multiplexed by column multiplexer 445 to a read-out bus (the "common column line") that is shared by all pixels (regardless of row) having the same column position. The common column line is controlled, per frame, by row-enable signals from row decoder 450. Column current source 455 provides bias current to the source followers belonging to the respective pixels.

The 448 columns are organized into fourteen banks of 32 columns each. A fourteen-channel parallel analog output buffer stage (not shown) multiplexes each of the fourteen banks of columns to a respective one of fourteen individual output buffers 460. The analog buffers 460 drive off-chip analog-to-digital converters (ADCs), which are not shown in FIG. 3.

High-Speed Timing Generator.

It is desirable to be able to generate shutter pulses having pulse lengths of nanoseconds or even less. In order to achieve such high-speed operation, our camera initiates the shutter pulses using a digital high speed timing generator. In this concept, a low jitter, fast start-up, on-chip oscillator creates a clock signal with a stable operating frequency. This clock signal drives a digitally programmable, arbitrary pulse generator. The pulse generator creates one or more shutter pulses and a corresponding pixel reset pulse.

In an illustrative example, there are two frame exposures (referred to below as Frame 0 and Frame 1) before each read-out. Accordingly, the pulse generator creates two shutter pulses with user-defined frame rates for each shutter pulse. By "frame rate" is meant the time between shutter pulses or the equivalent. It is adjustable and as noted, it is set by the user. The minimum frame rate in our example is 2 ns, i.e. the sum of a 1-ns shutter and a 1-ns interframe time. However, the user has substantial flexibility in adjusting the frame rate. For example, a user could configure the first frame at a 2-ns frame rate and the next at a 10-ns frame rate.

Figure 4:
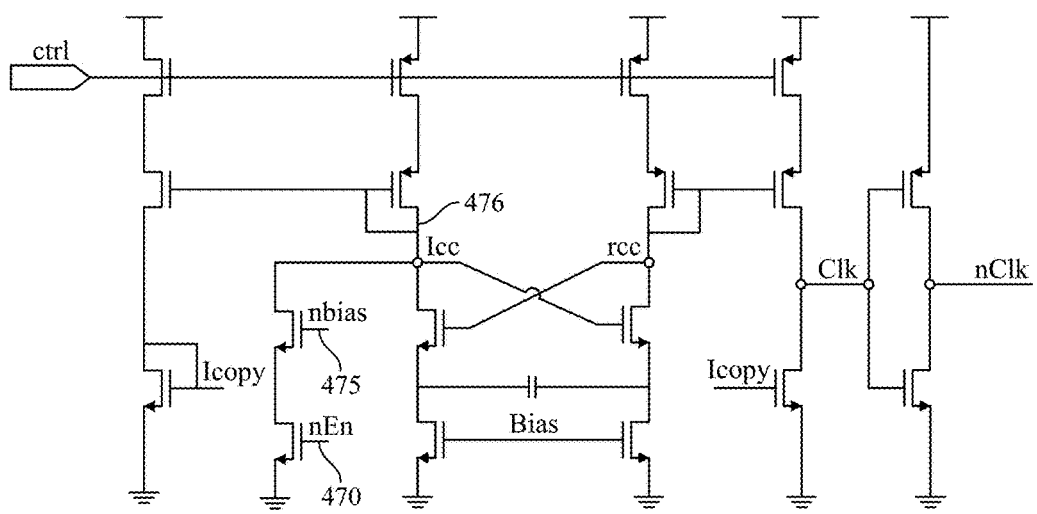
FIG. 4 is a schematic diagram of a fast start-up on-chip oscillator useful in implementations of a camera described here.

FIG. 4 is a schematic diagram of the fast start-up on-chip oscillator, in an illustrative embodiment. The oscillator is a voltage-controlled relaxation oscillator operating at 500 MHz and a 50% duty cycle. Advantageously, relaxation oscillators typically have controlled start-up characteristics and they typically achieve stable operation within a few cycles. An asynchronous external trigger is used to initiate the image capture event. This can be done with low jitter, at the expense of a small startup latency.

With reference to FIG. 4, the nEn signal on gate 470 functions as the asynchronous external trigger input. When nEn is a logic 1, current is shunted to ground, thereby disabling the oscillator. When nEn is a logic 0, the oscillator begins to operate. The $n_{bias}$ transistor 475 is biased with an analog bias voltage; it is introduced to keep the $i_{cc}$ node 476 from being pulled completely to ground. This $n_{bias}$ keeps the $i_{cc}$ node pre-charged while shunting enough current to prevent oscillation. Precharging the $i_{cc}$ node reduces startup time in the oscillator.

The Ctrl and nbias inputs are voltages, and the icopy input is a reference current, that all help tune the oscillator frequency. These inputs relate to the "Vfreq" signal represented as oscillator input in FIG. 5. The legends rcc, Bias, Clk, and nClk are annotations of input nodes that will be familiar to those skilled in the art. The nEn signal corresponds to the "Trig" signal represented as oscillator input in FIG. 5.

Figure 5:
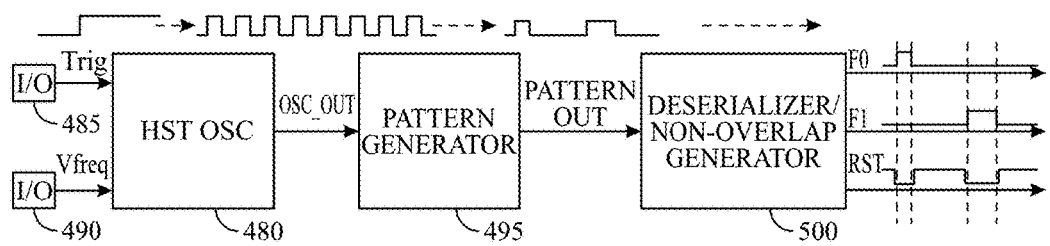
FIG. 5 is a flow-chart that illustrates an example architecture for high-speed timing in a camera of the kind described here.

FIG. 5 is a flow-chart that illustrates the architecture for the high-speed timing. At the left, oscillator 480, which corresponds to the oscillator of FIG. 4, is shown as having input ports 485 and 490. The trigger signal is applied at input port 485, and the frequency-controlling voltage level is applied at input port 490. As shown in the figure, the clock signal output from the oscillator is fed as input to pattern generator 495.

The pattern generator is pre-programmed with a timing pattern by configuring a pattern register. The timing pattern is specified by the shutter duration of each of the two frames and by the corresponding inter-frame time.

More specifically, the asynchronously triggered oscillator drives a shift register. The shift register creates a pulse stream by shifting out a user-programmed pattern set in the flip-flops of the shift register. The high level (logic 1) of the pulse stream is set by having flip-flops in the shift register preset to a logic 1 value. The low level of the pulse stream is set by having flip-flops in the shift register preset to a logic 0 value. The pulse stream is set by programming the flip-flops in the shift register with alternating patterns of logic 1 and logic 0 values. When the pulse generator is triggered, the programmed pattern is shifted out of the shift register at the speed of the base time step.

This architecture supports any number of flip-flops in the shift register provided that the clock skew between them can be kept low enough.

The pulse stream can be repeated by feeding the output of the shift register back into the input of the shift register. This architecture enables very fast, highly repeatable pulse generation for use in circuits requiring high speed and high precision.

The timing pattern that is output from the pattern generator is fed as input to block 500, which is a deserializer and non-overlap generator (DNOG). DNOG 500 deserializes the timing pattern so as to output the shutter pulses for Frame 0 on a first wire and the shutter pulses for Frame 1 on a second wire as separate, non-overlapping pulse trains. These pulses are typically single pulses, but the camera can also be placed in a "continuous" mode in which the pulse are generated many times repeatedly, for as long as the oscillator is enabled.

The DNOG also outputs a reset pulse on a third wire. The reset pulse is complementary to the two shutter pulses. The reset pulse is configured as a non-overlap pulse; i.e., it is spaced away from the edges of the frame shutter pulses so that the reset transistor will not be turned on at the same time as the shutter pulses in the pixel. Otherwise, charge on the hold capacitor would bleed away through the reset transistor, disrupting the ability to capture a known amount of charge.

The pattern register includes dual-edge D flip flops that perform as a frequency doubler so that the 500-MHz clock can be used to produce shutter pulses as small as 1 ns. By configuring the pattern generator appropriately, we can create non-uniform pulses for each frame. With frequency doubling, one-half the oscillator period is available as the basic unit of digital programmability. Thus, the user can choose a programmable shutter pattern of, e.g., a 1-ns shutter with a 1-ns inter-frame time, or a 2-ns shutter with an 8-ns inter-frame time, etc. More generally, any pattern can be accommodated if it fits within twenty of the basic time units, and within some limits the programmed pattern can even be extended out to forty time units. The arbitrary shutter pulses pass through the non-overlap generator to create the non-overlap reset pulse that corresponds to the user-selected shutters and inter-frame time.

High-Speed Timing Distribution.

The two high speed shutter signals, together with the single, complementary, non-overlap reset signal, are distributed in a row-wise manner. Accordingly, a total of three signals per row are replicated 1024 times in the vertical direction (i.e., once per row) and are distributed across the die area, which in an example is 25.6 mm×11.2 mm. This is challenging because the signal distribution must be accomplished with low row-to-row timing error across this large area.

Our solution is to provide symmetrical binary clock distribution trees in respective hemispheres, i.e. on the left side and on the right side of the pixel array. Within the clock tree in each hemisphere (also referred to here as a "replication tree" or a "binary clock tree"), the clock signal is driven through a series of buffers. One advantage of the hemispheric timing methodology is that it halves the RC load driven by each individual row buffer. A further advantage is that separate and independent timing for each hemisphere is available, which is useful, for example, if additional high-speed timing circuitry is implemented.

Figure 6:
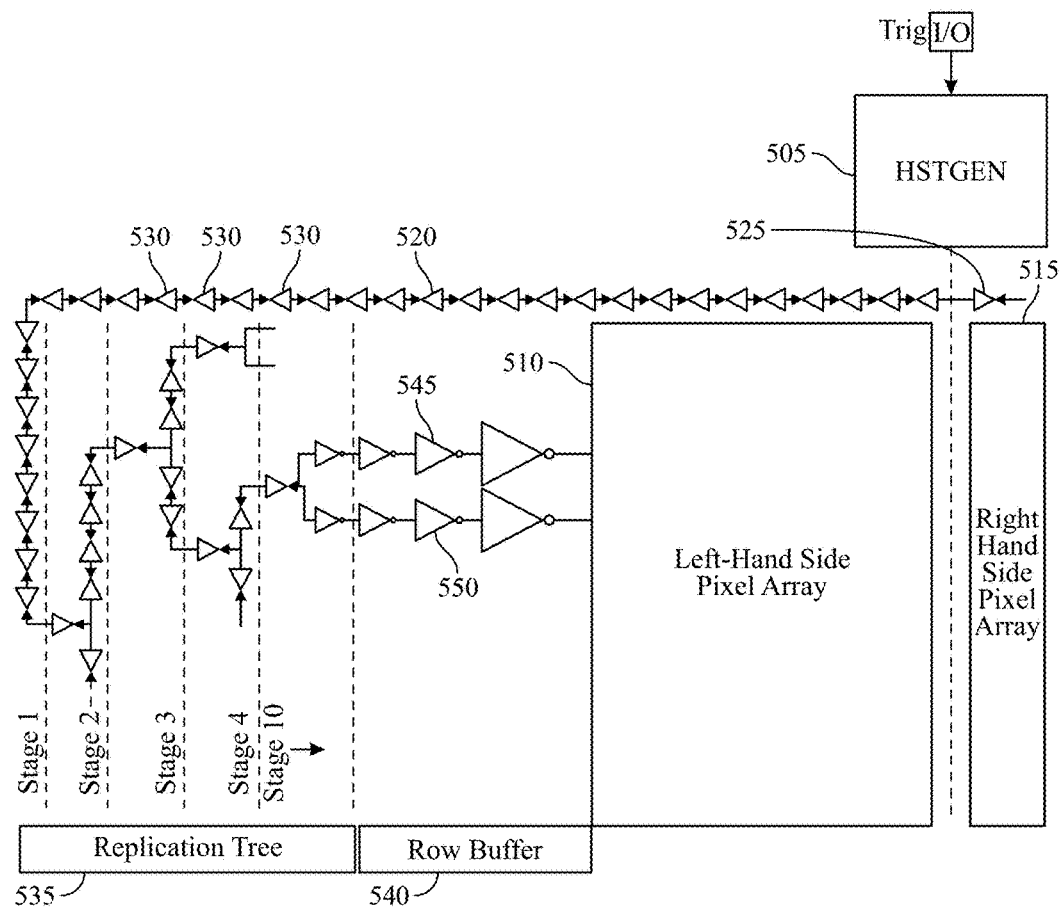
FIG. 6 is a simplified schematic diagram showing a replication tree for distributing a high-speed timing signal in an example high-speed camera.

FIG. 6 provides a simplified schematic diagram of the left-hand-side replication tree. The timing generator 505 is shown at the top of the figure. Below it are the left-hand side pixel array 510 represented symbolically as the larger of two boxes, and the right-hand side pixel array 515 represented as a smaller box. The signal traveling downward from the timing generator is divided onto a path 520 for the left hemisphere, and a path 525 for the right hemisphere, which is represented in the figure by a single buffer.

The left-hand path 520 passes through a series of buffers 530 and then enters a ten-stage binary replication tree 535 so as to generate $2^{10}=1024$ instantiations of the Frame-0 shutter signal, the Frame-1 shutter signal, and the reset signal. The instantiations are buffered in respective row buffers in row buffer stage 540. Two representative row buffers 545, 550 are indicated in the figure. Thus the instantiation for each row consists of two frame shutters on respective wires and a reset on a third wire. The row buffer includes respective buffers for each of the three signals.

Once the high-speed shutter signals have been replicated for each row, they need to be amplified sufficiently to drive the large RC load due to the 224 pixels that compose each half-row. This is done in the row buffer using a cascading gain stage.

The RC load that must be driven is a distributed load that includes 224 gate capacitances from the transistors that switch the respective shutters, and additionally, the RC of the metal interconnects. This distributed RC load behaves as a low-pass filter that tends to degrade the quality of the shutter pulses as they propagate inward from the outermost column of the pixel array. From simulations, we estimated a temporal skew of about 1 ps/pixel across a row in a prototype design due to the distributed RC load.

But pulse amplitude and pulse width tend to be degraded by the distributed RC load. The primary mechanism for the temporal skew is the RC delay added by each pixel. However, substantial attenuation of the signal amplitude can also lead to adverse effects such as increased skew or shorter pulse widths.

Figure 7:
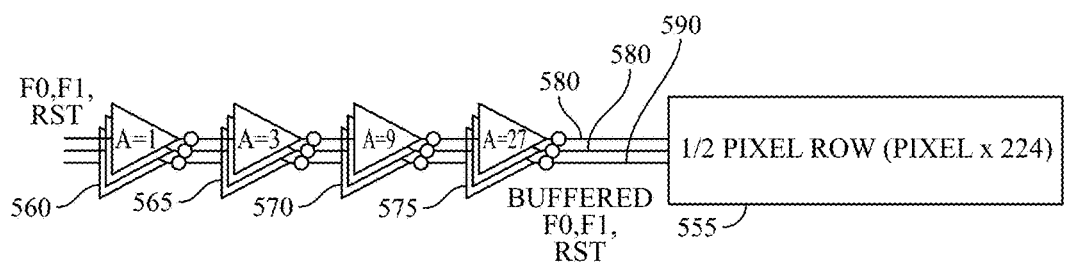
FIG. 7 is a block diagram of a gain stage for driving a half-row of pixels according to example implementations of a high-speed camera.

FIG. 7 is a block diagram of the cascading gain stage that drives one half-row 555. In this non-limiting example, there are four gain stages 560, 565, 570, 575, with respective gain factors of 1, 3, 9, and 27. The respective wires 580, 585, 590 for the Frame-0, Frame-1, and reset signals are also shown in the figure.

The Multiframe Pixel.

Figure 8:
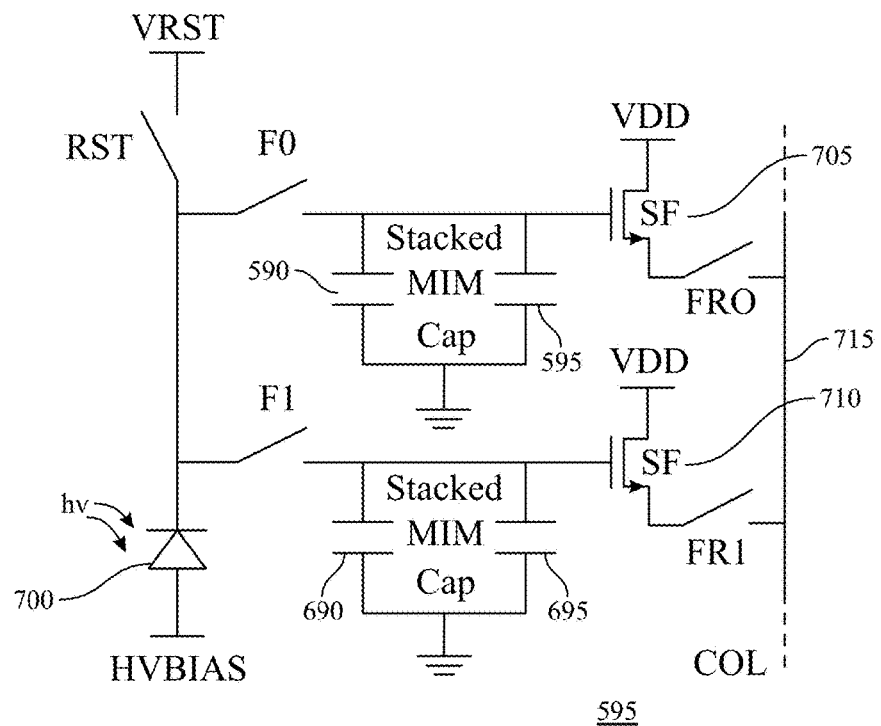
FIG. 8 is a schematic diagram of a unit pixel of a high-speed camera, contains in-situ storage for two frames.

FIG. 8 is a schematic diagram of a unit pixel that in this example contains in-situ storage for two frames. The pixel uses four 125-fF stacked MIM capacitors arranged in two pairs 590, 595 and 690, 695. Thus there is a total of 250 fF of full-well capacity per frame.

The shutter pulses are the signal inputs marked F0 and F1. The reset pulse is the signal input marked RST. A photodiode 700 is indicated.

In our prototype design, the pixel is designed for a 1.2-V signal swing. This is equivalent to a signal saturation level of about $1.88 \times 10^6$ electrons. The readout resolution (i.e., the least-significant-bit voltage) of an example analog-to-digital converter (ADC) used in our design is 1 mV. This corresponds to $1.6 \times 10^3$ electrons. Hence we estimate a dynamic range of about $(1.88/1.6) \times 10^3$, i.e. of 60 dB or somewhat more.

Each frame has an independent readout source-follower 705, 710. Both source-followers are multiplexed to a common column line 715 that is controlled by frame-specific row-enable signals.

Readout Decoding and Readout Buffering.

Figure 9:
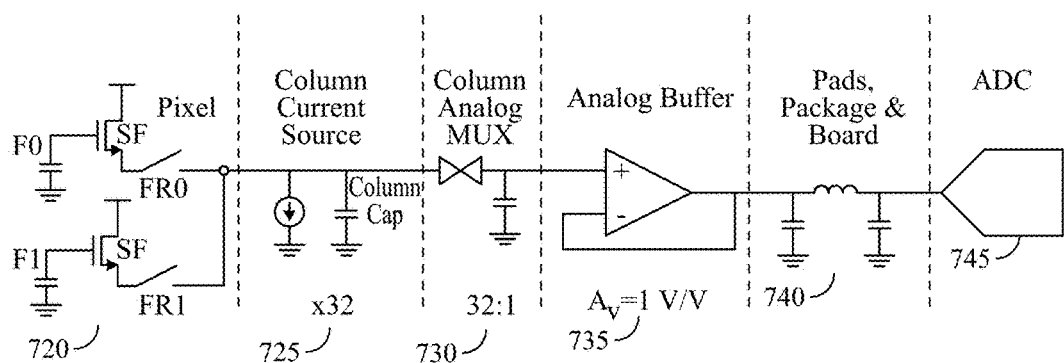
FIG. 9 is a simplified schematic diagram of the readout path in an example high-speed camera.

FIG. 9 is a simplified schematic diagram of the readout path in our prototype design. Included in the figure are pixel circuit 720, column current source 725, column analog multiplexer 730, analog output buffer 735, a symbolic representation 740 of inductive and capacitive loading due to contact pads, board-mounting, and packaging, and the ADC 745.

The readout method is conventional. A random access frame/row decoder (not shown) provides the FR0 and FR1 signals that activate the respective frame readouts from the pixel circuit. Each of the column current sources 725 provides a column-wise bias for the in-pixel source-followers.

The analog buffer stage 735 provides fourteen parallel channels for output buffering of analog image data. The column multiplexer stage 730 includes fourteen column multiplexers. Each column multiplexer multiplexes a bank of 32 pixel-array columns into a respective one of the fourteen analog output channels. Thus the multiplexed output of each bank of columns is directed to a respective one of the fourteen output buffers in analog buffer stage 735.

Each of the fourteen analog output buffers drives a respective off-chip ADC 745. It should be noted that providing random access allows for faster readout of the array for a given Region Of Interest (ROI).

At a clock rate of 500 Hz for the readout circuitry, two frames of the entire array of pixel data can be digitized in 131 ms.

Design Variation with Configurable Framing.

Figure 10:
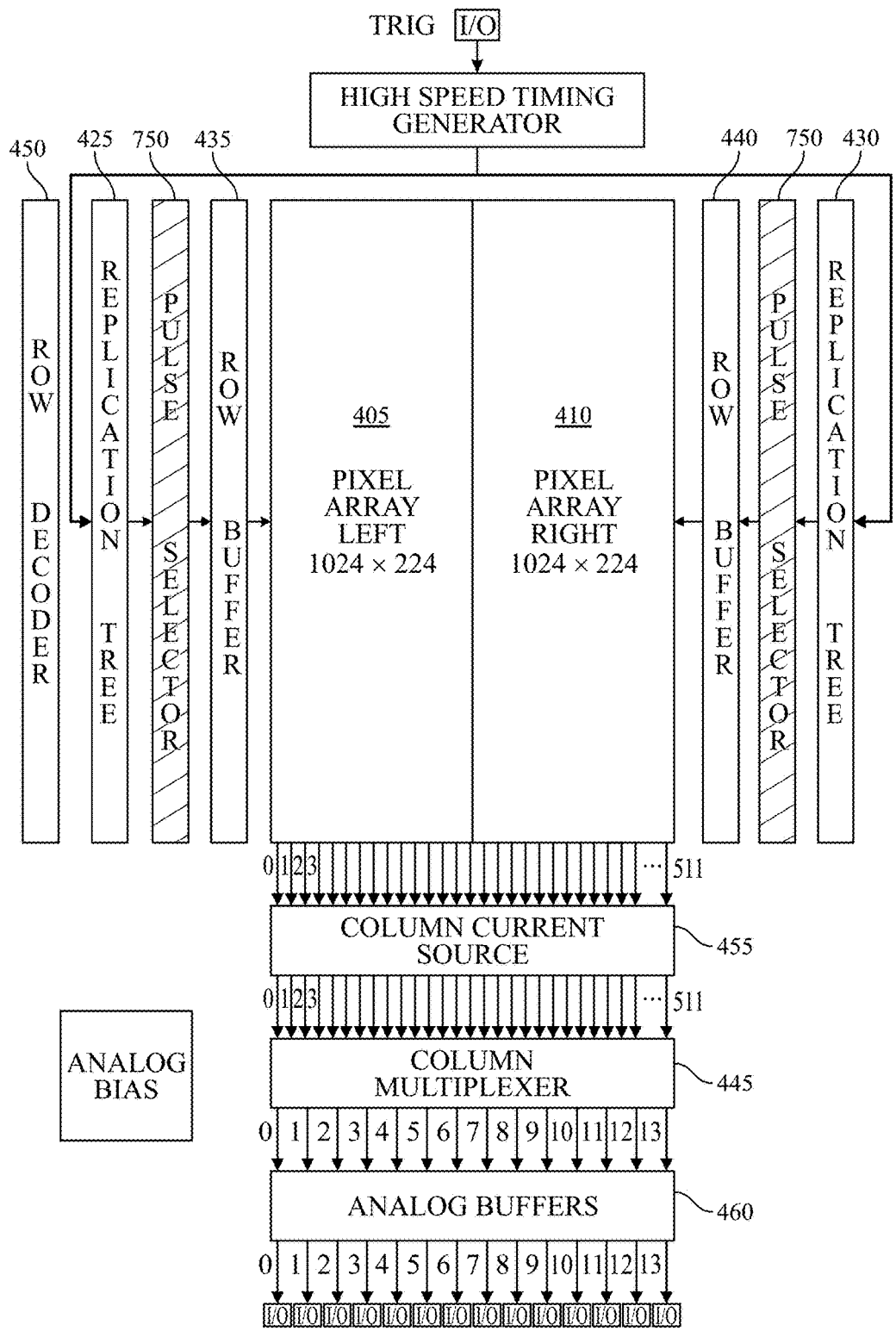
FIG. 10 is a high-level architectural diagram of a high-speed camera similar to the camera of FIG. 3, but implemented as a streak camera.

By adding circuitry to the timing-signal distribution path in the design described above and illustrated at a high level in FIG. 3, it is possible to implement a feature that configurably interlaces rows in such a way that more than two frames of data can be stored in-pixel between readouts. The additional circuitry is indicated in FIG. 10 as pulse selector 750. Other elements of FIG. 10 are designated by the same reference numerals that designate similar elements of FIG. 3.

Pulse selector 750 can be configured so that within Frame-0, and likewise within Frame-1, odd-numbered rows are apportioned to a first sub-frame and even-numbered rows are apportioned to a second sub-frame. In that manner, vertical (i.e., row-to-row) spatial resolution is halved in quality, but the number of frames available between readouts is doubled from two to four.

In a similar manner, every third row may be apportioned to a first subframe, the row preceding every third row may be apportioned to a second subframe, and the row next preceding each third row may be apportioned to a third subframe, thus providing six frames of data between readouts at the cost of a three-fold reduction in vertical spatial resolution.

In a similar manner, eight frames of data may be provided between readouts at the expense of a fourfold reduction in vertical spatial resolution by apportioning the first row and every fourth row thereafter to a first subframe, the second row and every fourth row thereafter to a second subframe, the third row and every fourth row thereafter to a third subframe, and the fourth row and every fourth row thereafter to a fourth subframe.

Further extensions of this idea are readily achievable and may be useful if the further reductions in vertical spatial resolution that they entail can be tolerated.

In our example, the operation of the pulse selector is as follows: A user specifies the desired interlacing mode by setting a pair of input pins on the ROIC. Thus {00} specifies no interlacing, {01} specifies two-row interlacing (i.e., 4 frames), {10} specifies three-row interlacing (6 frames), and {11} specifies four-row interlacing (8 frames).

The interlacing mode (specified as above) also sets the number of frame-shutter pulses that the high-speed timing logic will create. Logical circuitry implemented for each respective row within the pulse selector filters the arriving shutter pulses for that row and passes only the shutters appropriate to the selected interlacing mode.

In two-row (four-frame) interlacing, for example, the pulse selector passes the first and second shutter pulses and masks the third and fourth shutter pulses for each even row, while for the odd rows it masks the first and second pulses and passes the third and fourth pulses.

In an alternate embodiment, the number of distribution stages in the high-speed timing distribution path through the replication tree is reduced to reduce the timing skew between the left and right hemispheres. More specifically, we reduced the number of distribution buffers, which are used as signal repeaters over certain distances, and which are distinct from the binary replication buffers. In an early prototype, the repeater distance was about 500 µm, but in a later prototype we found that the distance could be increased to about 1 mm.

Streak Camera Implementation.

Figure 11:
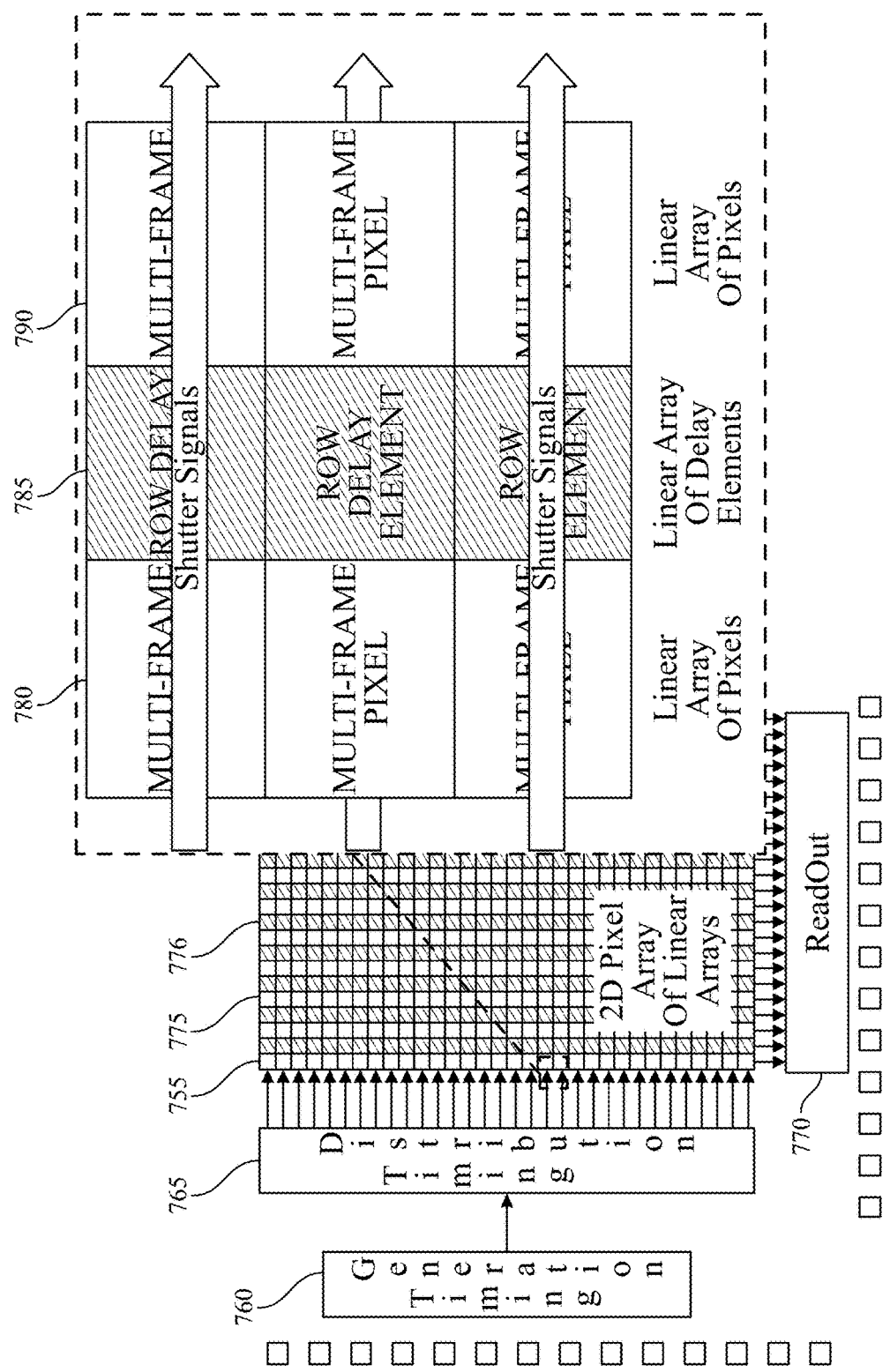
FIG. 11 is a block diagram illustrating a detail of the streak camera of FIG. 10.

In another implementation, the camera is configured as a streak camera that captures multiple one-dimensional images. The images can be spaced in time by a user-defined interval, which may be as small as 1 ns or even smaller. As shown in the block diagram of FIG. 11, the ROIC includes a two-dimensional pixel array 755, a circuit 760 for high-speed timing generation, a circuit 765 for timing distribution, and readout circuitry 770. Except as explained below, the circuitry can be implemented substantially as described above for framing camera implementations.

The pixel array 755 is arranged into pixel columns 775 that alternate with vertical linear arrays 776 of tunable delay elements. Each pixel column is a vertical linear array of pixels. The pixels in each column share a common column readout line.

In operation, the high-speed timing generation and distribution circuitry generates and replicates configurable frame shutter signals as described above. The replicated shutter signals are passed to respective rows of the two dimensional pixel array as described above. Upon reaching column 780, i.e. the first linear array of pixels, the shutter signals cause the pixels in that column to all simultaneously capture one or more frames of data.

The shutter signals pass from column 780 to column 785, i.e. to the first linear array of delay elements. The delay elements delay the shutter signals by a user-specified amount that is the same for all pixels in the column. Within the column, there is a delay element for each row. Each delay element delays the shutter signal for its respective row.

The delayed shutter signals then pass to the next column 790, i.e. to the second linear array of pixels, where they cause the pixels of that column to all simultaneously capture one or more frames of data.

The same process is repeated across the array 755, as the shutter signals continue to advance from a linear pixel array to the next linear delay of delay elements, from there to the next linear pixel array, etc., until the last column of the array is reached.

Design Variations with Redistributed Circuitry.

As explained above, the ROIC in example embodiments is bonded to the detector wafer to form a single monolithic structure. It often happens that the pixels in the ROIC are filled to capacity with the circuitry and metal routing needed to manage the capture, storage, and read-off of photogenerated charge. Pixels in the detector array are occupied by the P-N diode structures that convert radiation or particle energy into electrical charge.

In many instances, the metal routing within the detector wafer is relatively sparse. This leaves room to place MIM capacitors and/or metal resistors within the pixels of the detector array. For example, MIM capacitors can be connected between different metallization levels of the detector wafer. These capacitors and resistors can be useful for, e.g., altering the amount of charge that is converted in each pixel of the detector, relative to the amount of charge converted solely within the ROIC circuitry. As a consequence, the charge gain of the camera can be made to depend, in part, on circuitry that is added to the detector wafer. Hence for a given ROIC, the charge gain of the camera can be selected from among several alternatives by bonding the ROIC to a detector wafer chosen from a set of different detector wafers having different MIM capacitor sizes.

The capacitors and resistors in the detector pixel array can also be used to supply additional charge to circuitry in the ROIC. This supplementary charge can be used to mitigate effects caused by fast-transient device switching. These effects can strain the voltage on metal routes that distribute power in the ROIC.

Figure 12:
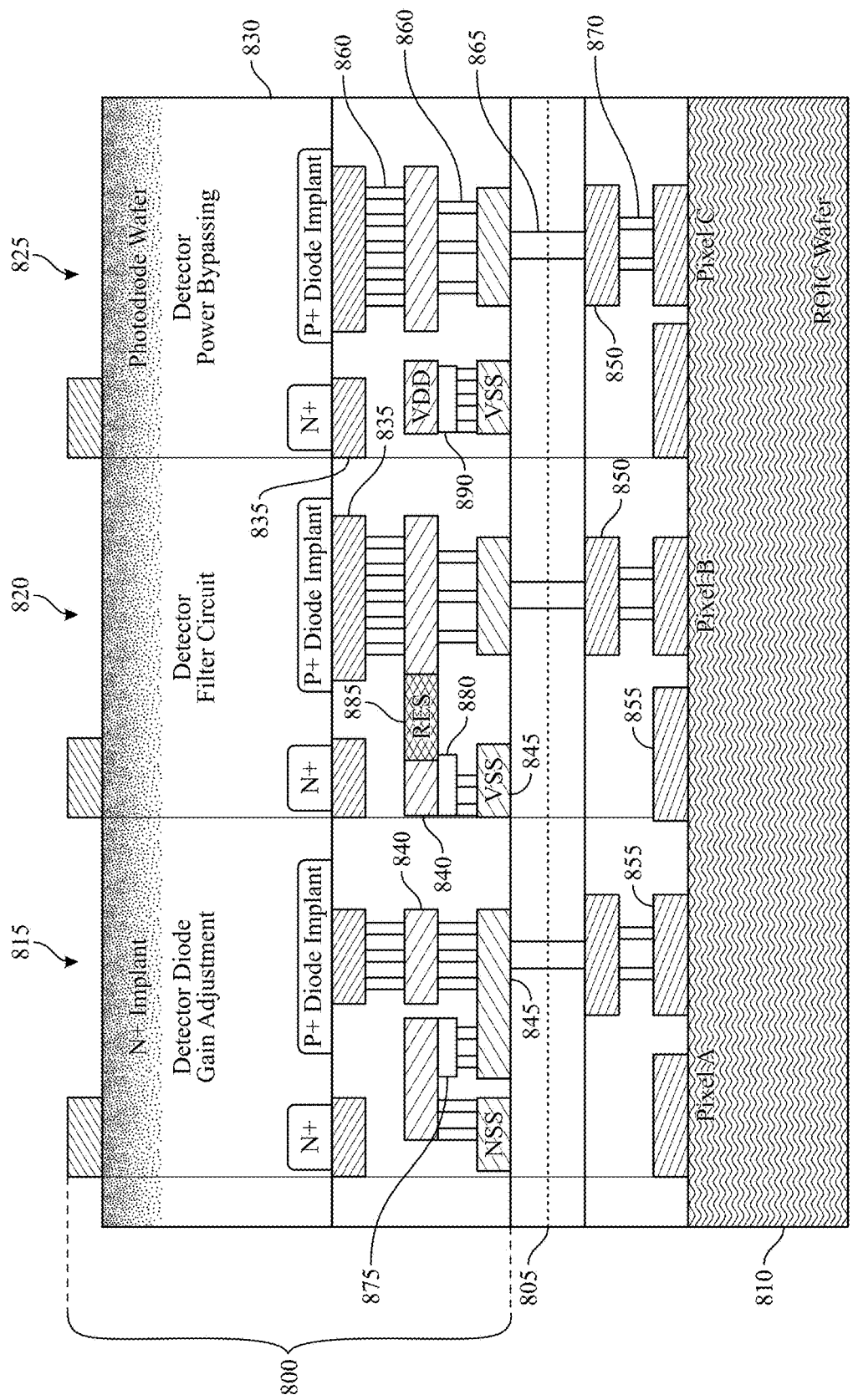
FIG. 12 is a simplified cross sectional diagram of a detector-ROIC assembly according to embodiments of the camera described here. In the figure, examples are presented of configurations of metal-insulator-metal capacitors within the detector wafer.

The simplified cross-sectional view of FIG. 12 provides examples of arrangements of MIM capacitors within the detector wafer. As shown in the figure, a photodiode wafer 800 is attached by an interposer 805 to a ROIC 810. Three illustrative pixels 815, 820, and 825 are shown.

The device layer 830 of the detector wafer is shown in direct contact with features 835 of the detector metal-1 layer. Also shown in the figure are representative features 840 of the detector metal-2 layer, features 845 of the detector metal-3 layer, features 850 of the ROIC metallization shown symbolically as encompassing the ROIC metal-3, metal-4, and metal-5 layers, and features 855 of the ROIC metallization shown symbolically as encompassing the ROIC metal-1 and metal-2 layers. Vias 860 are shown as providing vertical interconnection within the detector wafer. Vias 865 are shown as providing vertical interconnection within the interposer. Vias 870 are shown as providing vertical interconnection within the ROIC.

For purposes of illustration, pixel 815 is shown to include, within the detector wafer, a MIM capacitor 875 connected between metal-2 and metal-3 in a circuit arrangement for adjusting the gain of the detector diode. By way of further illustration, pixel 820 is shown to include, within the detector wafer, a MIM capacitor 880 connected between metal-2 and metal-3 in a circuit arrangement for filtering the detector output. As seen in the figure, capacitor 880 is connected in series with resistive element 885. By way of still further illustration, pixel 825 is shown to include, within the detector wafer, a MIM capacitor 890 connected between metal-2 and metal-3 in a circuit arrangement for bypassing detector power.

We claim:

1. Apparatus comprising:
    a photodiode array;
    an array of pixel circuits in which each individual pixel circuit is coupled to a respective photodiode of the photodiode array;
    an oscillator circuit having a master trigger input that starts the oscillator and an oscillator output that is periodic with an oscillator period;
    a pattern generator circuit having: an oscillator input coupled to the oscillator output, a reset output coupled to the individual pixel circuits, and at least first and second trigger outputs coupled to the individual pixel circuits for triggering respective first and second repeating frames; and
    a distribution network configured to distribute reset signals from the reset output and trigger signals from the trigger outputs to the individual pixel circuits;
    wherein:
    each pixel circuit comprises a storage element configured to store an output from the respective photodiode to which the said pixel circuit is coupled when the said pixel circuit receives a trigger signal;
    each pixel circuit is configured to reset its said storage element when the said pixel circuit receives a reset signal;
    the pattern generator circuit comprises a high speed shift register and a non-overlap generator, the shift register is programmable to produce a pulse train of trigger pulses that defines a frame's shutter duration and an interframe time between triggers for all frames, and the non-overlap generator deserializes the incoming pulse train of trigger pulses and produces a time separated reset pulse based on the pulse train of trigger pulses; and
    the shift register is configured to permit the frame durations and the interframe times to be selected arbitrarily over specified ranges in increments of a basic time unit that depends on the oscillator period.

2. The apparatus of claim 1, wherein the pattern generator circuit further comprises a frequency doubling circuit, and wherein the basic time unit is one-half the oscillator period.

3. The apparatus of claim 2, wherein the oscillator output comprises pulses each having two edges, and the frequency doubling circuit makes use of both edges of the oscillator output pulses.

4. The apparatus of claim 1, wherein the array of pixel circuits is partitioned into a left hemisphere and a right hemisphere, and the distribution network is divided into substantially symmetric left and right halves, each of which distributes trigger and reset signals to a respective hemisphere.

5. The apparatus of claim 4, wherein the left and right halves of the distribution network are configurable to independently distribute trigger and reset signals to their respective hemispheres.

6. The apparatus of claim 1, wherein:
the array of pixel circuits is arranged in a matrix of columns and rows of individual pixel circuits;
each of the repeating frames is subdivided among at least a first and a second subframe;
the rows of individual pixel circuits are partitioned among the subframes; and
the apparatus further comprises a pulse-select circuit that causes pixels only in those rows allocated to a particular subframe to be triggered when it is that subframe's turn to be triggered.

7. The apparatus of claim 1 configured as a streak camera, wherein:
the array of pixel circuits is arranged in a matrix that comprises columns and rows of individual pixel circuits;
in the array, the columns of individual pixel circuits are alternated with columns of delay elements; and
within each row, the individual pixel circuits receive trigger signals sequentially, such that each trigger signal is received after a cumulative delay due to all preceding delay elements.

8. The apparatus of claim 1, wherein:
the oscillator circuit comprises a relaxation oscillator configured in an astable multivibrator configuration in which two amplifying devices having respective inputs and outputs are cross-coupled;
the relaxation oscillator includes a path to ground from an ICC node coupled to an input of one of the cross-coupled devices;
the path to ground passes through a bias element and a trigger element;
the trigger element has an input that alternately enables and disables oscillation as it toggles between logic levels; and
the bias element is configured to maintain the ICC node at a voltage above ground that is controllable by an analog bias voltage applied to a bias input of the bias element.

9. The apparatus of claim 1, wherein the photodiode array is defined in a semiconductor detector chip, the array of pixel circuits is defined in a semiconductor read-out integrated circuit (ROIC) substrate, and the detector chip and the ROIC substrate are bonded in a monolithic assembly.

* * * * *